(12) United States Patent
Johnson

(10) Patent No.: US 6,559,706 B2
(45) Date of Patent: May 6, 2003

(54) MIXER CIRCUITRY

(75) Inventor: Peter Johnson, Bourne End (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/925,295

(22) Filed: Aug. 9, 2001

(65) Prior Publication Data

US 2002/0044002 A1 Apr. 18, 2002

(30) Foreign Application Priority Data

Aug. 10, 2000 (GB) .............................. 0019741

(51) Int. Cl.[7] .................................. G06F 7/44
(52) U.S. Cl. ...................... 327/359; 455/333
(58) Field of Search ................... 327/356, 357, 327/359; 455/326, 333

(56) References Cited

U.S. PATENT DOCUMENTS

| | | |
|---|---|---|
| 4,216,431 A | 8/1980 | Shibata et al. |
| 5,483,696 A | 1/1996 | Wheatley, III et al. |
| 5,584,066 A | 12/1996 | Okanobu |
| 5,825,231 A * | 10/1998 | Chevallier et al. .......... 327/356 |
| 5,901,350 A | 5/1999 | Stoichita et al. |
| 5,929,708 A | 7/1999 | Davis et al. |
| 5,959,491 A * | 9/1999 | Kang ........................ 327/359 |
| 6,040,731 A * | 3/2000 | Chen et al. ................. 327/359 |
| 6,104,227 A * | 8/2000 | Durec et al. ................ 327/359 |
| 6,275,688 B1 * | 8/2001 | Takagi et al. ............... 455/326 |
| 6,388,502 B2 * | 5/2002 | Kaneki et al. .............. 327/359 |

FOREIGN PATENT DOCUMENTS

GB 2218585 A 11/1989

* cited by examiner

Primary Examiner—Kenneth B. Wells
(74) Attorney, Agent, or Firm—Wolf, Greenfield & Sacks, P.C.; James H. Morris; Richard F. Giunta

(57) ABSTRACT

A mixer circuit is described having three transistors connected in series across the supply rails. Two of the transistors carry signals, and these are arranged to be close to but not in saturation so that the circuit can operate with very low supply voltages.

17 Claims, 1 Drawing Sheet

MIXER CIRCUITRY

FIELD OF THE INVENTION

The present invention relates to mixer circuitry and to a method of operating mixer circuitry.

BACKGROUND OF THE INVENTION

The prior art contains a number of examples of mixer circuitry for multiplying together two incoming signals to produce an output signal One known configuration of mixer circuitry contains a so-called "Gilbert cell". Gilbert cells consist of cross-coupled differential amplifiers composed of bipolar junction transistors. Typically, a first long tailed pair has loads formed by second and third differential pairs whose inputs and outputs are cross-coupled, the outputs being connected to a supply voltage via load resistors. The first long tailed pair has an emitter current source connected to a second supply voltage.

Such a mixer normally requires a minimum of three volts as its supply. This is because the Gilbert cell—assuming that the emitter current source is formed by a transistor—has three bipolar transistors connected across the supply voltage as well as series connected the load resistances. Attempts to reduce the supply voltage below three volts may result in transistors of the differential or long tailed pairs saturating, which has a number of disadvantageous effects. By saturation it is intended to mean providing a base voltage which is sufficiently higher than the collector voltage to cause conduction through the base-collector diode, ie. around 600 mV for a silicon transistor. Firstly, saturation entails an increase in base current. Secondly, capacitative effects cause the device to slow down.

SUMMARY OF THE INVENTION

It is accordingly an object of the present invention to at least partially mitigate the problems of the prior art.

According to a first aspect of the present invention there is provided a method of operating mixer circuitry, the mixer circuitry comprising a series circuit of the collector-emitter paths of first-third bipolar transistors, said first transistor having a collector forming one end of said circuit, the emitter of said second transistor being connected to the collector of said third transistor so that the collector voltage of said third transistor corresponds to the emitter voltage of the second transistor and said third transistor having an emitter forming a second end of said circuit, said series circuit being connected at said one end thereof via a first resistor to a supply potential and at said second thereof via a second resistor to a reference voltage, the method comprising:

providing a voltage drop across the first resistor, whereby said collector of said first transistor is at a potential between said supply potential and said reference voltage;

selecting a varying base voltage for application to a base of said first transistor, said base voltage having a maximum at least equal to said supply potential, being selected to provide a base-collector voltage at which conduction of the base-collector diode does not occur and having a minimum corresponding to a minimum voltage of said collector voltage of the second transistor;

providing a mixing base voltage to said second transistor, said mixing base voltage being selected to have a maximum level greater than the minimum collector voltage of said second transistor but less than a voltage at which the base-collector diode conducts, when the collector voltage is minimum, whereby the potential across said series circuit is less than three base-emitter voltages.

Preferably said third transistor is a dc bias transistor having a base terminal connected to receive a constant potential.

Advantageously said third transistor is a NPN device and has a base potential more than 500 mV above the collector potential.

Conveniently said step of providing a mixing base voltage comprises providing a varying voltage having a maximum and a minimum, the maximum being less than said supply voltage; offsetting said voltage by a predetermined amount toward said supply voltage whereby said offset voltage forms said mixing base voltage.

Conveniently again the method further comprises operating the third transistor in a saturated region at least when said mixing base voltage, and thereby the collector voltage of said third transistor, is minimum.

Advantageously said step of offsetting said voltage comprises providing said input voltage at one end of a resistor having a second end, providing a first constant current from said one end to said reference potential and providing a second constant current from said second end to said supply potential, wherein said second constant current is less than said first constant current.

Conveniently said second constant current is half said first constant current.

Preferably the method further comprises providing a varying input voltage at the base of an NPN transistor and deriving said voltage from an emitter of said transistor wherein said maximum of said input voltage corresponding substantially to the supply voltage.

Advantageously the method further comprises applying said second constant current to a diode as said constant potential of said dc bias transistor.

According to a second aspect of the present invention, there is provided a mixer circuitry comprising a series circuit of the collector-emitter paths of first-third bipolar transistors, said first transistor having a collector forming one end of said circuit and said third transistor having an emitter forming a second end of said circuit, the emitter of said second transistor being connected to the collector of said third transistor so that the collector voltage of said third transistor corresponds to the emitter voltage of the second transistor said series circuit being connected at said one end thereof via an output resistor to a supply potential and at said other end thereof via a bias resistor to reference voltage, the mixer circuitry having control circuitry connected to the base of said first transistor to provide a maximum potential on said base greater than the minimum collector voltage of said first transistor by an amount insufficient for conduction of the base-collector diode of said first transistor; mixing voltage—providing circuitry connected to the base of said second transistor, said mixing voltage—producing circuitry providing a maximum potential at the base of said second transistor, which is greater than the minimum collector voltage of said second transistor by an amount insufficient for conduction of the base-collector diode of said second transistor whereby the potential across said series circuit is less than three base-emitter voltages.

Preferably said third transistor is a dc bias transistor having a base terminal connected to receive a constant potential, and further comprising base-drive circuitry for operating the third transistor in a saturated region.

Advantageously said third transistor is a NPN device and said base drive circuitry has a base potential more than 500 mV above the minimum collector potential.

Preferably the mixer circuitry has an input for a voltage, and offset circuitry for offsetting said voltage by a predetermined amount toward said supply voltage, said offset circuitry having an output forming said mixing base voltage. conveniently the offsetting circuitry comprises a resistor having a first and a second end, said input being connected at said first end and a first constant current source being further connected to said first to said reference potential and a second constant current source connected from said second end to said supply potential, wherein said second constant current is less than said first constant current.

Advantageously said second constant current source provides half the current of said first constant current source Conveniently said maximum of said input voltage corresponding substantially to the supply voltage.

Conveniently a diode is connected to the base of said dc bias transistor and receives the output of said second constant current source.

BRIEF DESCRIPTION OF THE DRAWINGS

An embodiment of the present invention will now he described with reference to the accompanying drawing which shows an embodiment of mixing circuitry in accordance with the present invention.

DESCRIPTION OF PREFERRED EMBODIMENTS OF THE PRESENT INVENTION

Figure 1:
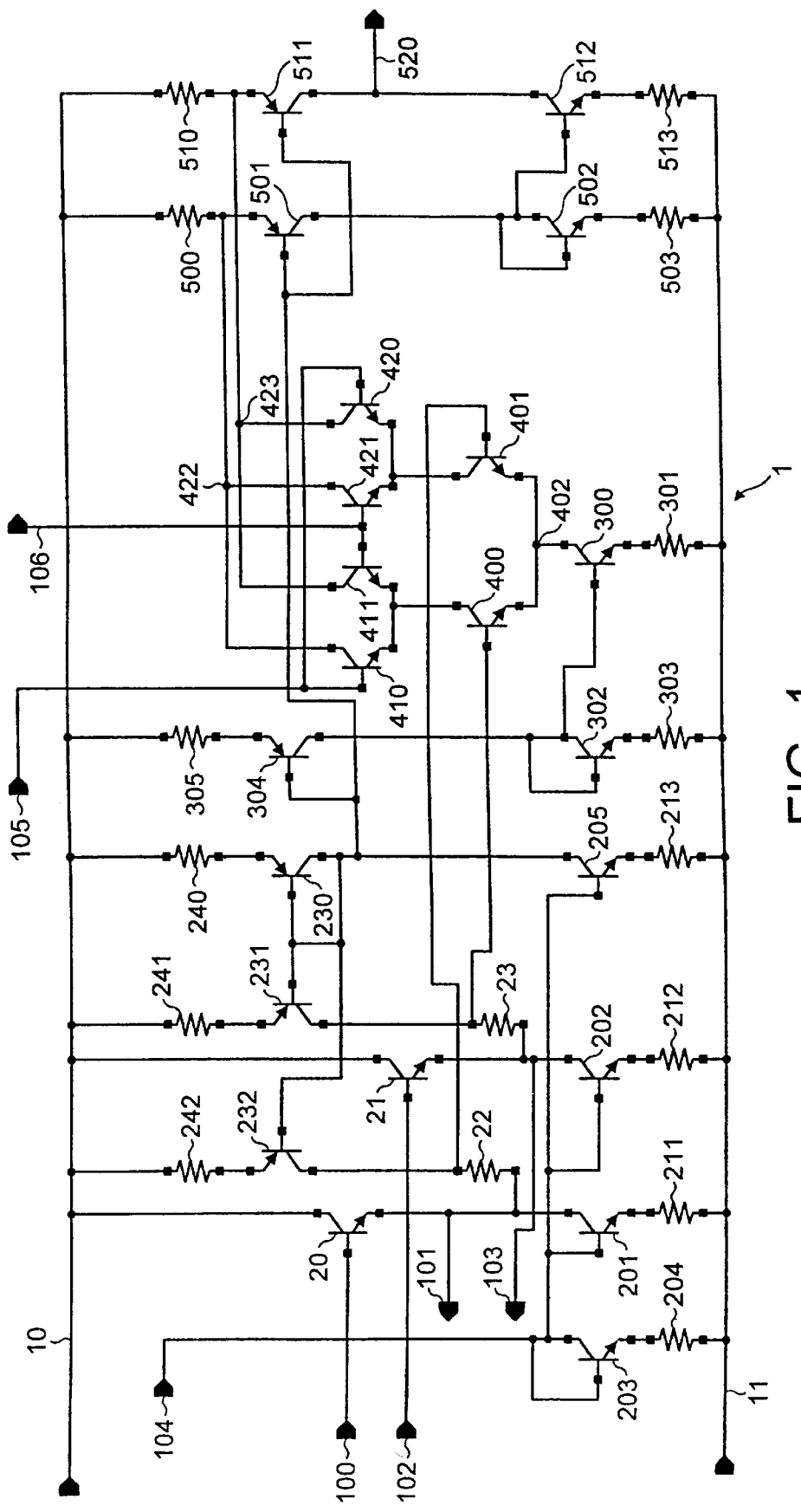
FIG. 1 shows a mixing circuit for mixing together first and second differential signals to provide an output signal.

The mixer 1 has a first positive supply rail 10 and a second reference or negative supply rail 11. A first NPN transistor 20 has its collector connected to the positive supply rail 10 and its base connected to a first input terminal 100. The emitter is connected to a second input terminal 101 and to the collector of a first controlled NPN bias transistor 201 whose emitter is connected via a bias resistor 211 to the reference supply rail 11. Likewise, a second NPN input transistor 21 has a connector connected to the positive supply rail 10, a base connected to a third input terminal 102 and an emitter connected to a fourth input terminal 103. The emitter terminal is connected via a second NPN controlled bias transistor 202 to the negative supply rail 11 via a second bias resistor 212. The bases of the first and second NPN controlled transistors 201, 202 are connected to a bias input terminal 104 which is connected via a diode-strapped controlling transistor 203 and a series bias resistor 204 to the negative supply rail 11. Bias input terminal 104 is further connected to the base of a third NPN controlled bias transistor 205 having an emitter connected to the negative supply rail by a fourth bias resistor 213 and a collector connected to the positive supply rail 10 via a diode-strapped controlling PNP transistor 230 having a bias resistor 240 connected between its emitter and the positive supply rail 10. The collector of the third NPN bias controlled transistor 205 is further connected to the base of a first PNP controlled bias transistor 231 whose emitter is connected via a bias resistor 241 to the positive supply rail 10 and to the base of a second PNP controlled bias transistor 232 whose emitter is connected to the positive supply rail via a second bias resistor 242 the collector of the second controlled PNP bias transistor 232 is connected to the emitter of the first NPN input transistor 20 via a first voltage dropper resistor 22 and the collector of the first controlled PNP bias transistor 231 is connected to the emitter of the second NPN input transistor 21 via a second voltage dropper resistor 23. The two voltage dropper resistors 22 and 23 are identical. The node between the collector of the second controlled PNP bias transistor 232 and the first voltage resistor dropper 22 forms one input node of a Gilbert cell mixer which will be described later herein and the node between the collector of the first controlled PNP bias transistor 231 and the second voltage dropper resistor 23 forms the second input to the Gilbert cell mixer.

The Gilbert cell mixer consists of a first pair of NPN transistors 400, 401 having a common emitter terminal 402. The collector of the first NPN transistor 400 is connected to the commoned emitters of a second NPN pair 410, 411 and the collector of the second NPN transistor 401 is connected to the commoned emitters of a third NPN pair 420, 421. The base of transistor 410 is connected to the base of transistor 420 and the commoned bases are connected to a first control terminal 105. The bases of the transistors 411 and 421 are connected together and to a second control terminal 106. The collector of transistor 410 is connected to the collector of transistor 421 at a node 422. The collectors of the transistors 411 and 420 are connected together at a second node 423. The first node 422 is connected firstly to the positive supply rail 10 via a first output resistor 500 and secondly to the negative supply rail 11 via the series connection of a first PNP output transistor 501 at its emitter, the collector of the first PNP output transistor 501 being connected via a diode-strapped first NPN output transistor 502 having an emitter connected to the negative supply rail 11 via a resistor 503. The second node 423 is connected on the one hand to the positive supply rail 10 via a second output resistor 510, and one the other hand to the negative supply rail via the series connection of a second PNP output transistor 511 at its emitter, the second PNP output transistor 511 having a collector forming an output node 520 connected via the main current path of a second NPN output transistor 512 having an emitter connected to the negative supply rail 11 via a further resistor 513. The bases of the first and second PNP output transistors 501, 511 are connected together to the collector of the third WPN controlled bias transistor 205. The base of the second NPN output transistor 512 is connected to the base and collector of the first NPN output transistor 502.

Emitter bias to the common emitter node 402 of the first pair 400, 401 is provided via an NPN current source transistor 300 having an emitter connected to the negative supply rail 11 via a current source resistor 301. The base of the current source transistor 300 is connected to a diode-strapped control NPN transistor 302, forming thereby a current mirror circuit. The control transistor for an emitter connected to the negative supply rail 11 via a bias resistor 303 and a common base/collector electrode connected to the collector of a PNP current source transistor 304. The current source transistor 304 has an emitter connected to the positive supply rail 10 via a bias resistor 305 and a base connected to the collector of the third NPN controlled bias transistor 205.

In the preferred embodiment, all of the transistors have the same aspect ratio with the exception of the first and second NPN controlled bias transistors 201, 202 which are both double size transistors.

The operation of the circuit will now be described.

To activate the mixer, a potential is supplied to the control terminal 104, and this gives rise to a current through the NPN controlling transistor 203. Assume for the sake of discussion that this current is selected to be 100 µA. Because of the double size of the transistors 201 and 202, the collectors of each of these transistors will sink a current of 200 µA and because of the single size of the third NPN controlled bias transistor 205, this will have a collector current of 100 µA. The collector current of third NPN controlled bias transistor 205 forms the control current to the controlling PNP transistor 230 and as a result the transistors 231, 232, 304, 501, 511 will all pass a current of 100 µA. The transistor 304 passes its collector current to the transistor 302, which, via current mirror action, sets the collector current of the long tailed pair bias transistor 300 to be 100 µA.

Resistor 213 is smaller than resistor 204 to increase the collector current of transistor 205, so as to compensate for base currents in transistors 204, 231, 232, 501 and 511. The first and second voltage dropper resistors 22, 23 will have a defined voltage drop across them due to a current flow of 100 µA passing through them. In the preferred embodiment, the resistors 22, 23 have a value of 3.4 k, which means that the voltage dropper resistors will cause the bases of transistors 400 and 401 to be 340 mV higher than the voltage at the emitters of input transistors 20, 21.

The Gilbert cell mixer is said to be in the balance state when the inputs 105 and 106 are identical and the input 100 and 102 are identical. The emitter current at node 402 is 100 µA and thus the currents 422 and 423 are 50 µA each.

Transistors 500 and 511 are biased to have 100 µA through each of resistors 500 and 510. When the Gilbert cell is balanced, mixer nodes 422 and 423 subtract 50 µA from each resistor leaving 50 µA to go to the emitter of transistors 500 and 511. In the extreme case of operation of the Gilbert cell mixer, all of the available current from node 402 goes through resistor 500 leaving 0 µA to go through transistor 501 (for example) the transistors 501, 511 are not ideal and thus the Vbe will change with emitter current in the transistors, in turn changing the voltage drop across the resistors 500 and 510.

The value of each resistor 500, 510 is 1.5 k, and as a result the typical departure from the positive supply rail 10 is 150 mV. Allowing for tolerances, including variation in Vbe, the maximum allowance for departure from the positive supply rail is 200 mV.

In a preferred method of operation, the second control terminal 106 is connected to the positive supply rail 10 and a varying control voltage is applied to the first control terminal 105, the potential varying about the positive supply potential. In the preferred embodiment, the control terminal 105 has an oscillatory amplitude around the power supply voltage of 100 mV peak. Thus, for the maximum potential at control terminal 105 of 100 mV above supply and the minimum collector voltage due to the voltage drop across the first or second output resistors 510 of 200 mV the collector of transistor 410 or 420 is at most 300 mV below the base terminal.

This results in the base-collector being forward biased, but insufficiently forward biased to result in conduction. Thus, the respective transistor is an incipient saturation condition in which a low collector-emitter voltage exists (here around 300 mV) but without the disadvantages of high base current or high capacitance.

Assume that the input signals applied to the first and third input terminals 100, 102 vary between the supply potential at the positive supply rail 10 and 200 mV less than this supply potential, then the voltage at the emitter of the first and second transistor 20, 21 will have a maximum of Vsupply−Vbe and a minimum of Vsupply−Vbe−0.2

Given the presence of the voltage dropper resistors 22, 23 the maximum base voltage applied to the first pair 400, 401 will be (for 100 µA bias current and 3.4 k resistance, as discussed above):

Vsupply−Vbe+340 mV

The minimum collector voltage of transistors 400, 401 will be:

Vsupply−100 mV−Vbe

Finally for the Gilbert cell mixer current source transistor 300 and resistor 301, the current through the transistor 300 is DC. The transistor can work into a higher saturated region where the base collector voltage Vbc is 510 mV. As is clear to those skilled in the art, because the transistor provides DC current, the base-collector capacitance can be high.

The minimum potential at node 402—the collector voltage of transistor 300—is:

Vsupply−0.2−2 Vbe+0.34

For a Vbe of 800 mV, the potential at 402 is:

1.8−0.2−0.8−0.8+0.34=0.34

The base potential of transistor 300 is the voltage across resistor 301+Vbe (+850 mV) Thus the base collector for transistor 300 is:

Vb−Vc=850−340=510 mV

Where slew problems arise at nodes 101,103 the currents through resistors 211, 212 may be increased to provide faster pull-down, values of resistance are thus selected as required.

I claim:

1. A method of operating mixer circuitry, the mixer circuitry comprising a series circuit of the collector-emitter paths of first-third bipolar transistors, said first transistor having a collector forming one end of said circuit, the emitter of said second transistor being connected to the collector of said third transistor so that the collector voltage of said third transistor corresponds to the emitter voltage of the second transistor and said third transistor having an emitter forming a second end of said circuit, said series circuit being connected at said one end thereof via a first resistor to a supply potential and at said second thereof via a second resistor to a reference voltage, the method comprising:

providing a voltage drop across the first resistor, whereby said collector of said first transistor is at a potential between said supply potential and said reference voltage;

selecting a varying base voltage for application to a base of said first transistor, said base voltage having a maximum at least equal to said supply potential, being selected to provide a base-collector voltage at which conduction of the base-collector diode does not occur and having a minimum corresponding to a minimum voltage of said collector voltage of the second transistor;

providing a mixing base voltage to said second transistor, said mixing base voltage being selected to have a maximum level greater than the minimum collector voltage of said second transistor but less than a voltage at which the base-collector diode conducts, when the collector voltage is minimum, whereby the potential across said series circuit is less than three base-emitter voltages.

2. The method of claim 1 wherein said third transistor is a dc bias transistor having a base terminal connected to receive a constant potential.

3. The method of claim 2 wherein said third transistor is a NPN device and has a base potential more than 500 mV above the collector potential.

4. The method of claim 2 wherein said step of providing a mixing base voltage comprises providing a varying voltage having a maximum and a minimum, the maximum being less than said supply voltage; offsetting said varying voltage by a predetermined amount toward said supply voltage whereby said offset voltage forms said mixing base voltage.

5. The method of claim 4 further comprising operating the third transistor in a saturated region at least when said mixing base voltage, and thereby the collector voltage of said third transistor, is minimum.

6. The method of claim 4 wherein said step of offsetting said varying voltage comprises providing said input voltage at one end of a resistor having a second end, providing a first constant current from said one end to said reference potential and providing a second constant current from said second end to said supply potential, wherein said second constant current is less than said first constant current.

7. The method of claim 6 wherein said second constant current is half said first constant current.

8. The method of claim 4 comprising providing a varying input voltage at the base of an NPN transistor and deriving said offset voltage from an emitter of said transistor wherein said maximum of said input voltage corresponding substantially to the supply voltage.

9. The method of claim 6 comprising applying said second constant current to a diode as said constant potential of said dc bias transistor.

10. A mixer circuitry comprising a series circuit of the collector-emitter paths of first-third bipolar transistors, said first transistor having a collector forming one end of said circuit and said third transistor having an emitter forming a second end of said circuit, the emitter of said second transistor being connected to the collector of said third transistor so that the collector voltage of said third transistor corresponds to the emitter voltage of the second transistor said series circuit being connected at said one end thereof via an output resistor to a supply potential and at said other end thereof via a bias resistor to reference voltage, the mixer circuitry having control circuitry connected to the base of said first transistor to provide a maximum potential or said base greater than the minimum collector voltage of said first transistor by an amount insufficient for conduction of the base-collector diode of said first transistor; mixing voltage—providing circuitry connected to the base of said second transistor, said mixing voltage—producing circuitry providing a maximum potential at the base of said second transistor, which is greater than the minimum collector voltage of said second transistor by an amount insufficient for conduction of the base-collector diode of said second transistor whereby the potential across said series circuit is less than three base-emitter voltages.

11. The mixer circuitry of claim 10 wherein said third transistor is a dc bias transistor having a base terminal connected to receive a constant potential.

12. The mixer circuitry of claim 11 wherein said third transistor is a NPN device and said base drive circuitry has a base potential more than 500 mV above the minimum collector potential.

13. The mixer circuitry of claim 11 having an input for a voltage, and offset circuitry for offsetting said voltage by a predetermined amount toward said supply voltage, said offset circuitry having an output forming said mixing base voltage.

14. The mixer circuitry of claim 13 wherein offsetting circuitry comprises a resistor having a first and a second end, said input being connected at said first end and a first constant current source being further connected to said first to said reference potential and a second constant current source connected from said second end to said supply potential, wherein said second constant current is less than said first constant current.

15. The mixer circuitry of claim 14 wherein said second constant current source provides half the current of said first constant current source.

16. The mixer circuitry of claim 12 wherein said maximum of said input voltage corresponding substantially to the supply voltage.

17. The mixer circuitry of claim 14 comprising a diode connected to the base of said dc bias transistor and receiving the output of said second constant current source.

* * * * *

UNITED STATES PATENT AND TRADEMARK OFFICE
CERTIFICATE OF CORRECTION

PATENT NO. : 6,559,706 B2
DATED : May 6, 2003
INVENTOR(S) : Huovila et al.

It is certified that error appears in the above-identified patent and that said Letters Patent is hereby corrected as shown below:

Column 8,
Line 5, change "or" to -- on --.

Signed and Sealed this

Twenty-sixth Day of August, 2003

JAMES E. ROGAN
*Director of the United States Patent and Trademark Office*